(12) United States Patent
Chan et al.

(10) Patent No.: US 8,114,736 B2
(45) Date of Patent: Feb. 14, 2012

(54) INTEGRATED CIRCUIT SYSTEM WITH MEMORY SYSTEM

(75) Inventors: Simon Siu-Sing Chan, Saratoga, CA (US); Hidehiko Shiraiwa, San Jose, CA (US); Kuo-Tung Chang, Saratoga, CA (US); Angela T. Hui, Fremont, CA (US)

(73) Assignees: Globalfoundries Inc., Grand Cayman (KY); Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/958,254

(22) Filed: Dec. 17, 2007

(65) Prior Publication Data

US 2008/0150042 A1    Jun. 26, 2008

Related U.S. Application Data

(60) Provisional application No. 60/871,434, filed on Dec. 21, 2006.

(51) Int. Cl.
*H01L 21/336* (2006.01)
*H01L 29/788* (2006.01)

(52) U.S. Cl. ............... 438/257; 257/315; 257/E27.103; 257/E21.585; 257/E21.69; 257/E21.679

(58) Field of Classification Search .................. 257/390, 257/751, E21.679, E27.103, E21.577, E21.537, 257/E21.69, E21.683, E21.686, 314–316, 257/E21.649, E21.477, E21.507, E21.585, 257/E21.584; 438/653, 315, 266, 257, 258, 438/233, 230, 231, 232, 629, 639, 657, 675
See application file for complete search history.

(56) References Cited

U.S. PATENT DOCUMENTS

| | | | |
|---|---|---|---|
| 4,870,470 A * | 9/1989 | Bass et al. | 257/324 |
| 5,768,186 A | 6/1998 | Ma | |
| 6,271,087 B1 * | 8/2001 | Kinoshita et al. | 438/258 |
| 6,689,658 B2 * | 2/2004 | Wu | 438/257 |
| 6,744,096 B2 | 6/2004 | Lee et al. | |
| 6,933,226 B2 | 8/2005 | Lee et al. | |
| 7,049,187 B2 | 5/2006 | Yamamoto et al. | |
| 7,091,087 B2 * | 8/2006 | Hurley | 438/257 |
| 7,109,547 B2 | 9/2006 | Shimizu et al. | |
| 2001/0002713 A1 * | 6/2001 | Goda et al. | 257/315 |
| 2002/0171112 A1 * | 11/2002 | Shimizu et al. | 257/390 |
| 2004/0113196 A1 * | 6/2004 | Rudeck et al. | 257/314 |
| 2004/0166631 A1 * | 8/2004 | Hurley | 438/257 |
| 2005/0101081 A1 * | 5/2005 | Goda et al. | 438/222 |
| 2006/0038218 A1 * | 2/2006 | Yaegashi et al. | 257/314 |
| 2006/0110874 A1 * | 5/2006 | Kim | 438/209 |
| 2006/0237767 A1 * | 10/2006 | Sakuma et al. | 257/314 |
| 2007/0012991 A1 * | 1/2007 | Yaegashi | 257/315 |
| 2007/0034938 A1 * | 2/2007 | Kang et al. | 257/316 |

* cited by examiner

*Primary Examiner* — Matthew Landau
*Assistant Examiner* — Latanya N Crawford
(74) *Attorney, Agent, or Firm* — Farjami & Farjami LLP

(57) ABSTRACT

A method for forming an integrated circuit system is provided including forming a memory section having a spacer with a substrate, forming an outer doped region of the memory section in the substrate, forming a barrier metal layer over the spacer, and forming a metal plug over the outer doped region and the barrier metal layer.

20 Claims, 4 Drawing Sheets

INTEGRATED CIRCUIT SYSTEM WITH MEMORY SYSTEM

CROSS-REFERENCES TO RELATED APPLICATION

This application claims the benefit of U.S. Provisional Patent Application No. 60/871,434, filed Dec. 21, 2006.

TECHNICAL FIELD

The present invention relates generally to integrated circuit systems and more particularly to integrated circuit systems having a memory system.

BACKGROUND ART

Modern electronics, such as smart phones, personal digital assistants, location based services devices, digital cameras, music players, servers, and storage arrays, are packing more integrated circuits into an ever-shrinking physical space with expectations for decreasing cost. One cornerstone for electronics to continue proliferation into everyday life is the non-volatile storage of information such as cellular phone numbers, digital pictures, or music files. Numerous technologies have been developed to meet these requirements.

There are many types of non-volatile data storage, such as Hard Disk Drives, magneto-optical drives, compact disk (CD), digital versatile disk (DVD), and magnetic tape. However, semiconductor based memory technologies have advantages of very small size, mechanical robustness, and low power. These advantages have created the impetus for various types of non-volatile memories, such as electrically erasable programmable read only memory (EEPROM) and electrically programmable read only memory (EPROM). EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become popular because it combines the advantages of the high density and low cost of EPROM with the electrical erasability of EEPROM. Flash memory can be rewritten and can hold its contents without power. Contemporary Flash memories are designed in a floating gate or a charge trapping architecture. Each architecture has its advantages and disadvantages.

The floating gate architecture offers implementation simplicity. This architecture embeds a gate structure, called a floating gate, inside a conventional metal oxide semiconductor (MOS) transistor gate stack. Electrons can be injected and stored in the floating gate as well as erased using an electrical field or ultraviolet light. The stored information may be interpreted as a value "0" or "1" from the threshold voltage value depending upon charge stored in the floating gate. As the demand for Flash memories increases, the Flash memories must scale with new semiconductor processes. However, new semiconductor process causes a reduction of key feature sizes in Flash memories of the floating gate architecture, which results in undesired increase in programming time, and decrease in data retention.

The charge trapping architecture offers improved scalability to new semiconductor processes compared to the floating gate architecture. One implementation of the charge trapping architecture is a silicon-oxide-nitride-oxide semiconductor (SONOS) where the charge is trapped in the nitride layer. The oxide-nitride-oxide structure has evolved to an oxide-silicon rich nitride-oxide (ORO) for charge trapping structure. Leakage and charge-trapping efficiency are two major parameters considered in device performance evaluation. Charge-trapping efficiency determines if the memory devices can keep enough charges in the storage nodes after program/erase operation and is reflected in retention characteristics. It is especially critical when the leakage behavior of storage devices is inevitable.

Memory density increase or evolution with new semiconductor technologies involves trade-offs. Some of these trade-offs include number of process steps, process technology complexities, electrical performance trade-offs, cost, and overall yield. One approach is to simplify manufacturing steps while improving electrical performance of the memory architectures.

Thus, a need still remains for an integrated circuit system with memory integration providing low cost manufacturing, improved yields, and improved electrical performance of memory in a system. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including forming a memory section having a spacer with a substrate, forming an outer doped region of the memory section in the substrate, forming a barrier metal layer over the spacer, and forming a metal plug over the outer doped region and the barrier metal layer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1A:
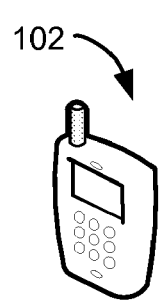
FIGS. 1A, 1B, and 1C are schematic views of examples of electronics systems in which various aspects of the present invention may be implemented.

In the following description, numerous specific details are given to provide a thorough understanding of the invention.

However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Figure 1B:
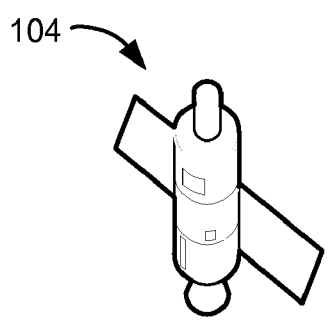
Figure 1C:
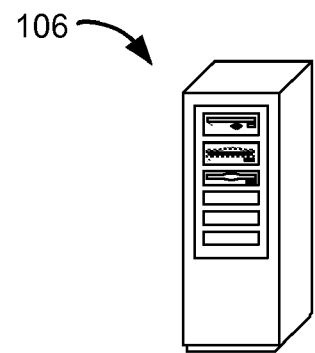

Referring now to FIGS. 1A, 1B, and 1C, therein are shown schematic views of examples of electronics systems in which various aspects of the present invention may be implemented. A smart phone 102, a satellite 104, and a compute system 106 are examples of the electronic systems using the present invention. The electronic systems may be any system that performs any function for the creation, transportation, storage, and consumption of information. For example, the smart phone 102 may create information by transmitting voice to the satellite 104. The satellite 104 is used to transport the information to the compute system 106. The compute system 106 may be used to store the information. The smart phone 102 may also consume information sent from the satellite 104.

The electronic systems, such as the smart phone 102, the satellite 104, and the compute system 106, include a one or more subsystem, such as a printed circuit board having the present invention or an electronic assembly having the present invention. The electronic system may also include a subsystem, such as an adapter card.

Figure 2:
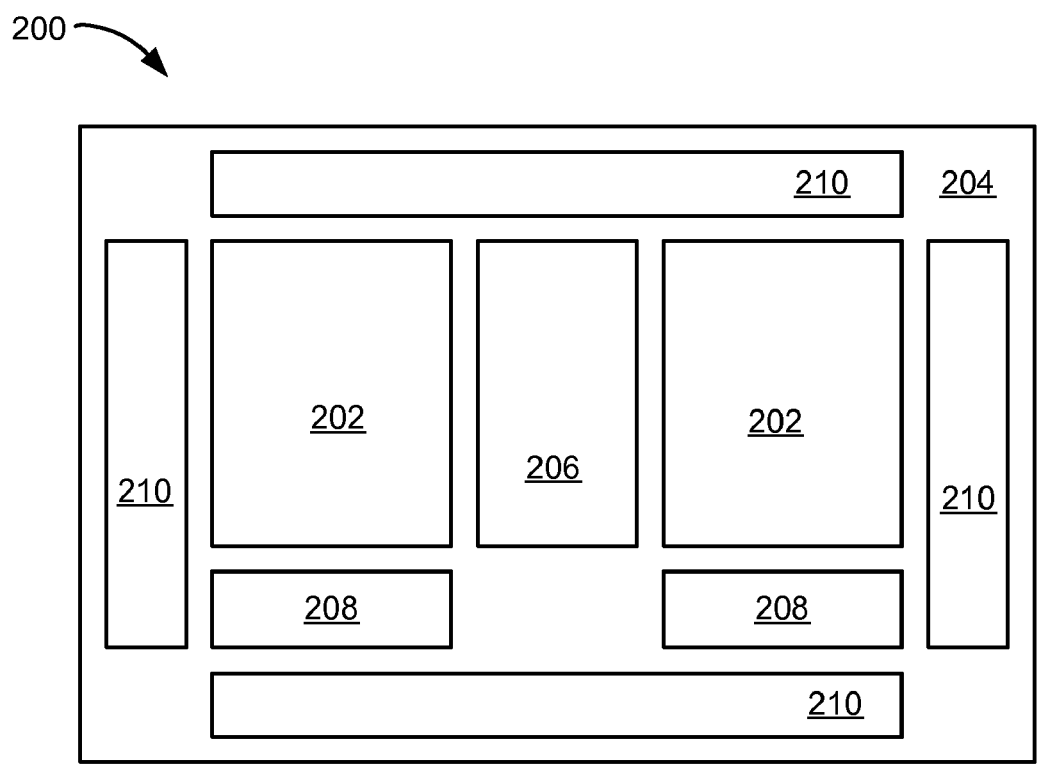
FIG. 2 is a plan view of an integrated circuit system in an embodiment of the present invention.

Referring now to FIG. 2, therein is shown a plan view of an integrated circuit system 200 in an embodiment of the present invention. The plan view depicts memory systems 202 in a substrate 204, such as a semiconductor substrate, wherein the substrate 204 has one or more high-density core regions and one or more low-density peripheral portions are formed.

High-density core regions typically include one or more of the memory systems 202. Low-density peripheral portions typically include peripheral circuitry 210, such as input/output (I/O) circuitry or transistors interfacing to the memory systems 202, and programming circuitry for individually and selectively addressing a location in each of the memory systems 202.

The programming circuitry is represented in part by and includes one or more x-decoders 206 and y-decoders 208, cooperating with the peripheral circuitry 210 for connecting the source, gate, and drain of selected addressed memory cells to predetermined voltages or impedances to effect designated operations on the memory cell, e.g. programming, reading, and erasing, and deriving necessary voltages to effect such operations. For illustrative purposes, the integrated circuit system 200 is shown as a memory device, although it is understood that the integrated circuit system 200 may other semiconductor devices having other functional blocks, such as a digital logic block, a processor, or other types of memories.

Figure 3:
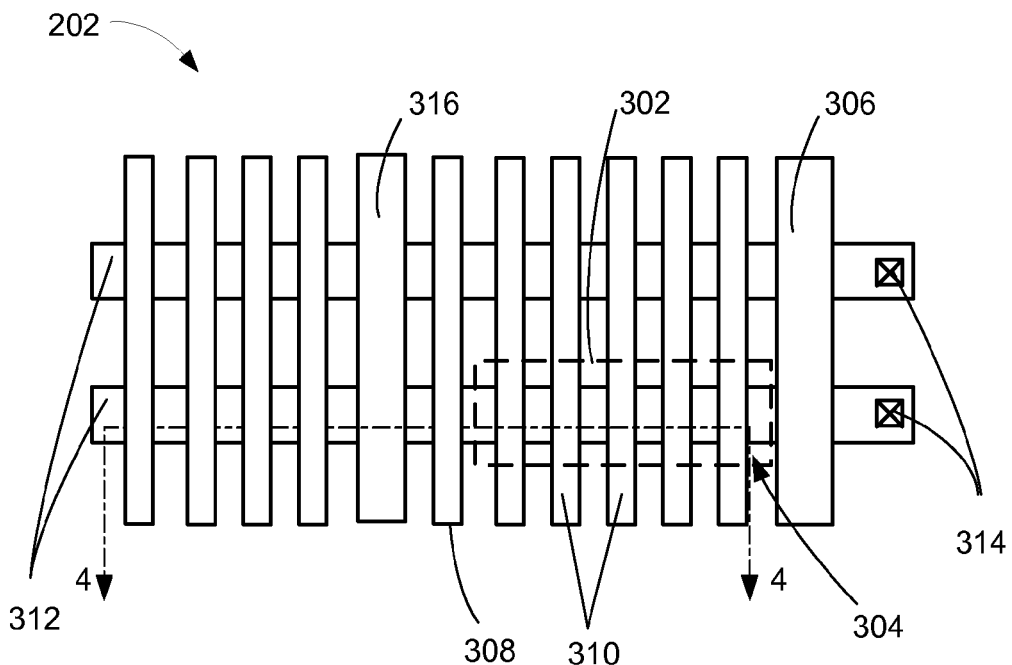
FIG. 3 is a more detailed plan view of a portion of the memory systems of FIG. 2.

Referring now to FIG. 3, therein is shown a more detailed plan view of a portion of the memory systems 202 of FIG. 2. The plan view depicts two instances of a memory section 302, such as NAND memory series, in each column. The memory section 302 has memory cells 304 between a drain select line 306 and a source select line 308. The memory cells 304 have word lines 310 above bit lines 312, wherein the word lines 310 and the bit lines 312 are perpendicular to each other. The drain select line 306 and the source select line 308 are also perpendicular to the bit lines 312. Contacts 314, such as drain contacts, are on the bit lines 312 next to the drain select line 306. A common source line 316 is perpendicular to the bit lines 312 and next to the source select line 308.

Figure 4:
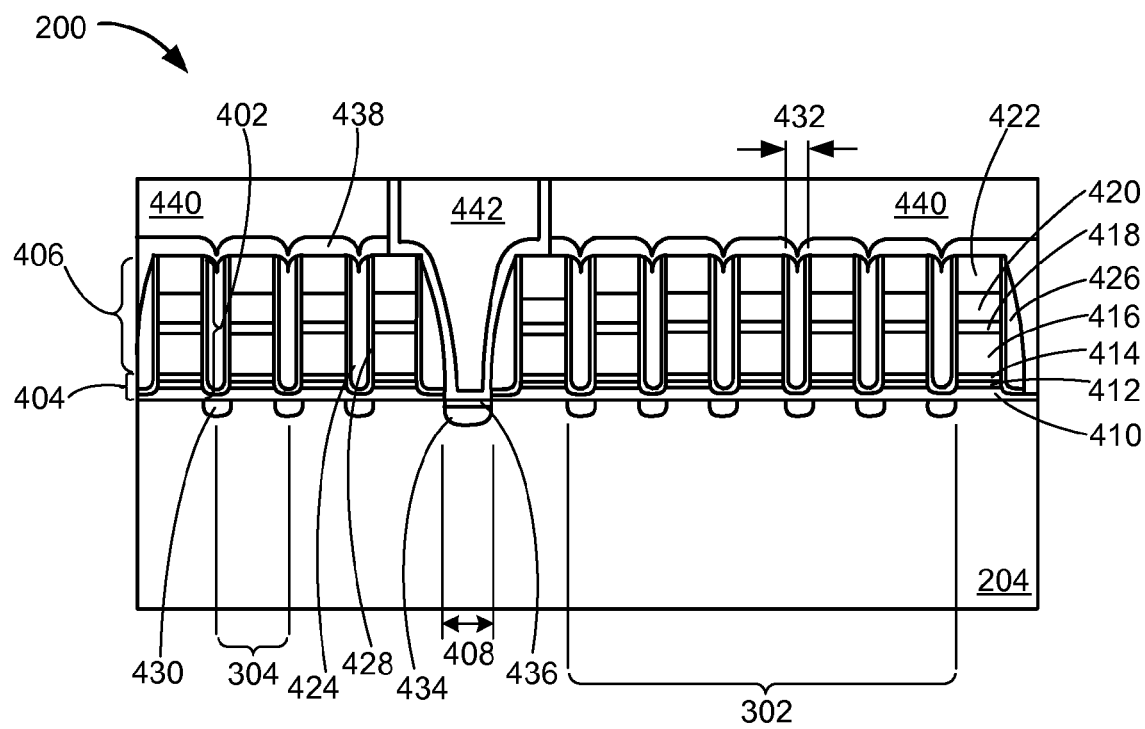
FIG. 4 is a cross-sectional view of the integrated circuit system along a line segment 4-4 of FIG. 3 in an embodiment of the present invention.

Referring now to FIG. 4, therein is a cross-sectional view of the integrated circuit system 200 along a line segment 4-4 of FIG. 2 in an embodiment of the present invention. The cross-sectional view depicts the memory section 302 over the substrate 204. The memory section 302 has a plurality of memory stacks 402 over the substrate 204.

Each of the memory stacks 402 includes a charge storage stack 404, such as an oxide-silicon rich nitride-oxide (ORO) stack, and a plurality of stack headers 406 over the charge storage stack 404. The charge storage stack 404 has a first insulator region 410, a charge trap region 412, and a second insulator region 414. The first insulator region 410, such as a bottom tunneling oxide region, is over the substrate 204. The charge trap region 412, such as a silicon rich nitride region, is over the first insulator region 410. The second insulator region 414, such as a top blocking oxide region, is over the charge trap region 412.

Each of the stack headers 406 has a semi-conducting region 416, a transition region 418, a metal region 420, and a cap region 422. The semi-conducting region 416, such as a polysilicon region, formed over the substrate 204 and the charge storage stack 404. The transition region 418, such as a tungsten nitride (WN) region, is over the semi-conducting region 416. The metal region 420, such as a tungsten (W) region, is over the transition region 418. The transition region 418 prevents reaction between the metal region 420 and the semi-conducting region 416. The cap region 422, such as a silicon nitride (SiN) layer, is over the metal region 420.

A dielectric lining 423 with an overlaying gap filler 424, such as a nitride filler, is between adjacent instances of the stack headers 406. A spacer 426, such as a nitride spacer, is also along a sidewall 428 of each of the stack headers 406 at the ends of the memory section 302. An inner doped region 430, such as an n-minus doped region, in the substrate 204 is under a gap 432 between the stack headers 406 and the charge storage stack 404 that are adjacent to each other.

An inner region width of the inner doped region 430 is similar to or substantially the same as the width of the gap 432. An outer doped region 434, such as an n-plus doped region, in the substrate 204 is at the end of the memory section 302. The outer doped region 434 is not covered by the spacer 426 and the charge storage stack 404. The outer doped region 434 has an outer region width 408 that is larger than the width of the gap 432. The difference in widths of the inner doped region 430 and the outer doped region 434 allows for a high density of the memory cells 304 with the inner doped region 430 while providing sufficient volume or area for electrical current flow through the outer doped region 434.

A silicide layer 436, such as a titanium silicide, cobalt silicide or nickel silicide layer, is preferably over the outer doped region 434. An etch stop layer 438, such as a silicon nitride etch stop layer, is over the gap filler 424, the spacer 426, and the memory stacks 402. An interlayer dielectric 440 is over the etch stop layer 438 and the substrate 204. A metal plug 442, such as a tungsten (W) plug with titanium/titanium nitride (Ti/TiN) bilayer barrier metal, connects to the silicide layer 436 and the outer doped region 434 through the interlayer dielectric 440, forming the common source line 316 for the memory sections 302 of FIG. 3.

One of the memory cells 304 includes one of the memory stacks 402 and the adjacent instances of the inner doped region 430. The inner doped region 430 may function as a source or drain in the memory section 302. The outer doped region 434 may function as a source or drain of the memory section 302.

Figure 5:
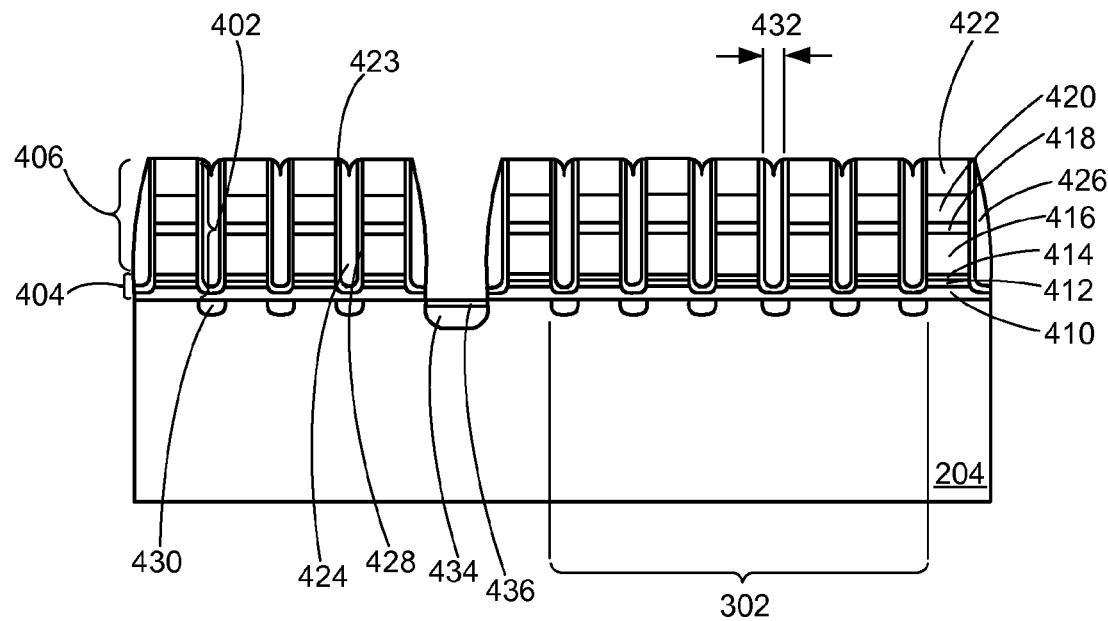
FIG. 5 is a cross-sectional view of the integrated circuit system of FIG. 4 in a source/drain forming phase.

Referring now to FIG. 5, therein is shown a cross-sectional view of the integrated circuit system of FIG. 4 in a source/drain forming phase. The cross-sectional view depicts a first insulator region 410, such as an oxide layer, is formed over the substrate 204. A charge trap region 412, such as a silicon-rich nitride layer (SRN or SiRN) or silicon nitride ($Si_xN_y$), is formed over the first insulator region 410. The silicon-rich nitride may be formed by a chemical vapor deposition process (CVD) using $NH_3$ and $SiCl_2H_2$ but not limited to the two chemicals. A ratio of the gases, such as $NH_3:SiCl_2H_2$, range from 1:40 to 1:1 can produce silicon-rich nitride with a ratio of Si to N higher than 0.75.

For illustrative purposes, the charge trap region 412 is shown as a single layer, although it is understood that the charge trap region 412 may have multiple layers, such as a nitride layer over a silicon rich nitride layer. Also for illustrative purposes, the charge trap region 412 is shown as a single uniform layer, although it is understood that the charge trap region 412 may include one or more layer having a concentration gradient, such as different gradient concentrations of silicon.

A second insulator region 414, such as an oxide layer, is formed over the charge trap region 412 forming the layers of the charge storage stack 404. The second insulator region 414 may be formed over the charge trap region 412 with a number of different processes, such as chemical vapor deposition (CVD) or thermal oxidation. Alternatively, the second insulator region 414 may be formed from a top portion of the charge trap region 412 with slot plane antenna (SPA) oxidation.

The stack headers 406 are formed over the second insulator region 414. The semi-conducting region 416 is formed over the second insulator region 414. The transition region 418 is formed over the semi-conducting region 416. The metal region 420 is formed over the transition region 418. The transition region 418 prevents reaction between the metal region 420 and the semi-conducting region 416. The cap region 422 is formed over the metal region 420. The metal region 420 may be connected as the word lines 310 of FIG. 3. Adjacent instances of the stack headers 406 have the gap 432 in between.

The second insulator region 414 and the charge trap region 412 are preferably separated isolating the charge storage stack 404 by removing portions of the charge storage stack 404 not covered by the stack headers 406. The removal process may be performed in a number of ways. For example, the charge storage stack 404 may undergo anisotropic etch without removal of the cap region 422 and without removal of the first insulator region 410 within the gap 432.

The inner doped region 430 is preferably formed within the gap 432 and through the first insulator region 410. The inner doped region 430 may be formed in a number of ways. For example, the ion implantation through the first insulator region 410 exposed by the gap 432 may form the inner doped region 430.

The dielectric lining 423 and the gap filler 424 thereover is formed over the substrate 204 covering the memory section 302. The gap filler 424 fills the gap 432 between adjacent instances of the stack headers 406 and the memory stacks 402. The spacer 426 is formed along the sidewall 428 of the stack headers 406 at the ends of the memory section 302

The structure having the gap filler 424 and the spacer 426 preferably undergoes another implantation forming the outer doped region 434. The implantation process may be performed by a number of different processes, such as ion implantation or multiple implantation steps. The energy for ion implantation may be varied as needed for forming the predetermined doping in the substrate 204. The implanted dopants in the outer doped region 434 and the inner doped region 430 are preferably activated by rapid thermal annealing.

The outer doped region 434 may be optionally silicided by selectively removing the dielectric lining 423 and the first insulator region 410 not covered by the spacer 426, followed by the deposition of a metal, such as titanium (Ti), cobalt (Co), nickel (Ni), or platinum (Pt), and annealing. Unreacted metal is preferably removed by wet etching forming a silicide layer 436. The silicide layer 436, such as cobalt silicide ($CoSi2$), is optional.

Figure 6:
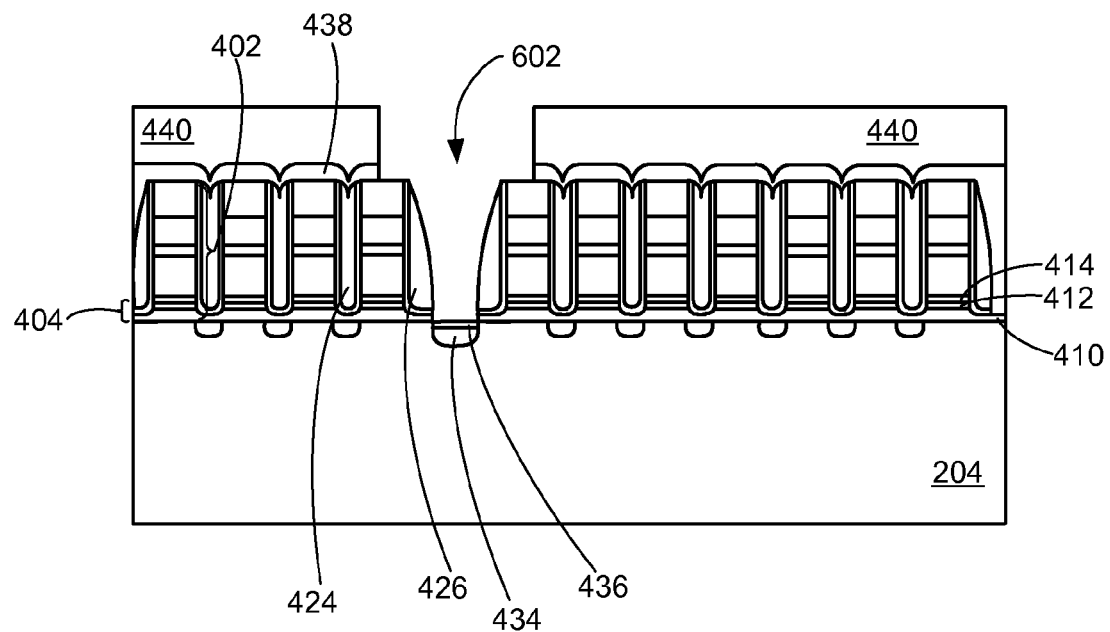
FIG. 6 is the structure of FIG. 5 in a source trench forming phase.

Referring now to FIG. 6, therein is shown the structure of FIG. 5 in a source trench forming phase. The etch stop layer 438 is formed over the gap filler 424, the spacer 426, and the memory stacks 402. The inter-layer dielectric 440 is formed over the etch stop layer 438, the memory stacks 402, and the substrate 204. The inter-layer dielectric 440 undergoes a planarization process, such as chemical and mechanical planarization (CMP).

A source trench 602 is preferably formed by anisotropic etching through a photoresist mask (not shown) and in the inter-layer dielectric 440. The etch stop layer 438 functions as an etch stop layer providing an outline of the source trench 602 over the spacer 426. The etching process preferably continues removing the etch stop layer 438 exposed by the source trench 602, thereby exposing the silicide layer 436. The etching process may expose the outer doped region 434 in a process that does include the silicide layer 436, which is optional.

Figure 7:
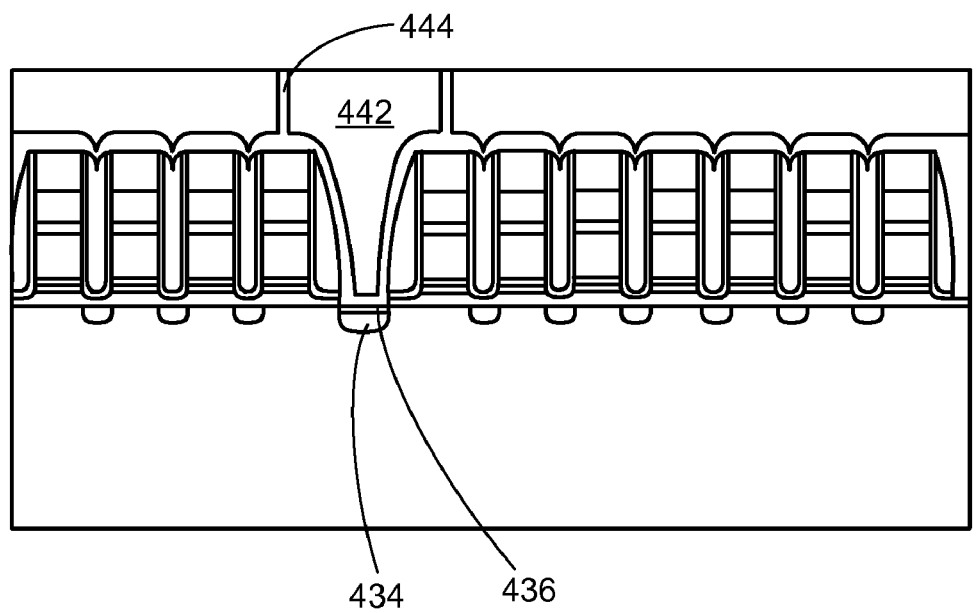
FIG. 7 is the structure of FIG. 6 in a plug forming phase.

Referring now to FIG. 7, therein is shown the structure of FIG. 6 in a plug forming phase. The barrier metal layer 444, such as a titanium/titanium nitride (Ti/TiN) bilayer, is formed over the structure of FIG. 6. A metal, such as tungsten, is deposited in the source trench 602 and over the barrier metal layer 444. Chemical mechanical polish (CMP) of the metal forms a metal plug 442, wherein the metal plug 442 preferably functions as the common source line 316 of FIG. 3 for the memory sections 302. The silicide layer 436 reduces the resistance between the metal plug 442 and the outer doped region 434. For illustrative purposes, the metal plug 442 connects to the outer doped region 434 with the silicide layer 436, although it is understood that the metal plug 442 may be connected to the outer doped region 434 without the silicide layer 436.

Figure 8:
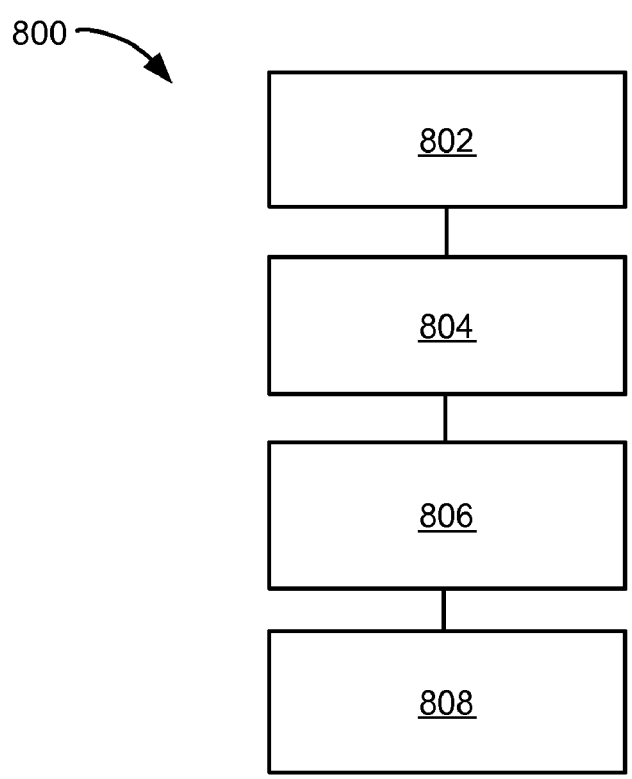
FIG. 8 is a flow chart of an integrated circuit system for manufacture of the integrated circuit system in an embodiment of the present invention.

Referring now to FIG. 8, therein is shown a flow chart of an integrated circuit system 800 for manufacture of the integrated circuit system 200 in an embodiment of the present invention. The system 800 includes forming a memory section having a spacer with a substrate in a block 802; forming an outer doped region of the memory section in the substrate in a block 804; forming a barrier metal layer over the spacer in a block 806; and forming a metal plug over the outer doped region and the barrier metal layer in a block 808.

These and other valuable aspects of the embodiments consequently further the state of the technology to at least the next level.

Thus, it has been discovered that the integrated circuit system method and apparatus of the present invention furnish important and heretofore unknown and unavailable solutions, capabilities, and functional aspects for integrated systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for forming an integrated circuit system comprising:
    forming a memory section having a spacer with a substrate;
    forming an outer doped region of the memory section in the substrate not below the memory section;
    forming a barrier metal layer over the spacer lateral to a sidewall of the memory section; and
    forming a metal plug over the outer doped region and the barrier metal layer;
    wherein the outer doped region is wider than an inner doped region of the memory section and the substrate is not doped under the spacer.

2. The method as claimed in claim 1 wherein forming the barrier metal layer includes forming titanium.

3. The method as claimed in claim 1 wherein forming the metal plug includes forming a tungsten plug.

4. The method as claimed in claim 1 wherein forming the outer doped region includes forming a source region.

5. The method as claimed in claim 1 further comprising forming an electronic system or a subsystem with the integrated circuit system.

6. A method for forming an integrated circuit system comprising:
    forming a memory section having a charge storage stack and a spacer with a substrate;
    forming an outer doped region of the memory section in the substrate not below the memory section;
    forming a barrier metal layer over the spacer lateral to a sidewall of the memory section; and
    forming a tungsten plug over the outer doped region and on the barrier metal layer;
    wherein the outer doped region is wider than an inner doped region of the memory section and the substrate is not doped under the spacer.

7. The method as claimed in claim 6 wherein forming the memory section having the charge storage stack includes forming a silicon rich nitride portion.

8. The method as claimed in claim 6 wherein forming the memory section includes forming memory cells in a series.

9. The method as claimed in claim 6 further comprising connecting a source line and the tungsten plug.

10. The method as claimed in claim 6 further comprising forming a silicide layer between the tungsten plug and the outer doped region.

11. An integrated circuit system comprising:
    a memory section having a spacer with a substrate;
    an outer doped region of the memory section in the substrate not below the memory section;
    a barrier metal layer over the spacer lateral to a sidewall of the memory section; and
    a metal plug over the outer doped region and the barrier metal layer;
    wherein the outer doped region is wider than an inner doped region of the memory section and the substrate is not doped under the spacer.

12. The system as claimed in claim 11 wherein the barrier metal layer includes titanium.

13. The system as claimed in claim 11 wherein the metal plug includes a tungsten plug.

14. The system as claimed in claim 11 wherein the outer doped region includes a source region.

15. The system as claimed in claim 11 further comprising an electronic system or a subsystem with the integrated circuit system.

16. The system as claimed in claim 11 wherein:
    the memory section has a charge storage stack and the spacer over the substrate;
    the outer doped region of the memory section in the substrate is not below the memory section;
    the barrier metal layer includes titanium and is over the spacer; and
    the metal plug is a tungsten plug over the outer doped region and on the barrier metal layer.

17. The system as claimed in claim 16 wherein the memory section having the charge storage stack includes a silicon rich nitride portion.

18. The system as claimed in claim 16 wherein the memory section includes memory cells in a series.

19. The system as claimed in claim 16 further comprising a source line connected with the tungsten plug.

20. The system as claimed in claim 16 further comprising a silicide layer between the tungsten plug and the outer doped region.

* * * * *